United States Patent
Armentrout

(12) 
(10) Patent No.: US 6,421,113 B1
(45) Date of Patent: Jul. 16, 2002

(54) PHOTOLITHOGRAPHY SYSTEM INCLUDING A SMIF POD AND RETICLE LIBRARY CASSETTE DESIGNED FOR ESD PROTECTION

(75) Inventor: Lewis Lynn Armentrout, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/504,006

(22) Filed: Feb. 14, 2000

(51) Int. Cl.[7] .......................... G03B 27/52; G03B 27/42
(52) U.S. Cl. .......................... 355/75; 355/53; 206/709; 206/719; 414/935
(58) Field of Search ...................... 355/53, 75; 206/709, 206/710, 711, 719, 454, 455; 414/935, 937, 939, 940

(56) References Cited

U.S. PATENT DOCUMENTS

| | | | |
|---|---|---|---|
| 4,739,882 A | * 4/1988 | Parikh et al. | 206/455 |
| 4,815,912 A | * 3/1989 | Maney et al. | 414/217 |
| 5,442,163 A | * 8/1995 | Nakahara et al. | 235/381 |
| 5,559,584 A | * 9/1996 | Miyaji et al. | 355/53 |
| 5,611,452 A | * 3/1997 | Bonora et al. | 206/454 |
| 5,743,409 A | * 4/1998 | Nakahara et al. | 206/710 |
| 5,895,191 A | * 4/1999 | Bonora et al. | 414/940 |
| 6,196,391 B1 | * 3/2001 | Li | 206/719 |

FOREIGN PATENT DOCUMENTS

EP  0846983 A2 * 10/1998

* cited by examiner

*Primary Examiner*—Alan A. Mathews
(74) *Attorney, Agent, or Firm*—Kevin L. Daffer; Conley, Rose & Tayon P.C.

(57) ABSTRACT

A lithography system including a reticle carrier and reticle library cassette designed for electro-static discharge (ESD) protection. A reticle carrier, such as a SMIF (Standard Mechanical Interface) pod, and reticle library cassette are fabricated largely of electrically conductive materials. Such materials may include polycarbonate plastic impregnated with carbon fibers or an electrically conductive stainless steel. The electrically conductive materials used to fabricate the reticle carrier and reticle library cassette may allow static electrical charges to be drained to ground, thereby preventing ESD damage to the reticles. Furthermore, the reticle carrier may incorporate rounded edges and corners, which may aid in the prevention of static charge buildup near the pod.

21 Claims, 9 Drawing Sheets

PHOTOLITHOGRAPHY SYSTEM INCLUDING A SMIF POD AND RETICLE LIBRARY CASSETTE DESIGNED FOR ESD PROTECTION

BACKGROUND OF THE INVENTION

1. Field of the Invention

This invention relates to semiconductor processing equipment, and more specifically, to reticle pods and cassettes used in photolithography systems.

2. Description of the Relevant Art

Lithography is an integral part of integrated circuit fabrication. Optical lithography may be used to pattern various structures, such as circuit interconnect lines and trench isolation structures. To form these structures, a photosensitive material, referred to as a photoresist, is applied to a wafer of semiconductor substrate. Light is then projected onto the photoresist through a mask, which defines the pattern to be created on the photoresist. This is repeated for each die on the wafer, although the mask structure may include multiple instances of the same pattern, known as a mask reticle or "reticle", allowing the pattern to be projected to multiple die. Those areas of the photoresist that are exposed to the light source are rendered either soluble or insoluble to a particular solvent. Following the exposure of the photoresist to the light source, the solvent (often referred to as a developer) is used to remove soluble portions of the photoresist. The remaining areas of the photoresist may then be used to protect the covered portions of the semiconductor substrate, while etching those areas which are exposed.

FIG. 1 is a plan view of an exemplary reticle, with a pattern similar to one which may be applied to a semiconductor substrate. In this example, the chrome/opaque areas (within the lines) shield the substrate from the light source, while the quartz/clear areas allow light to pass to the photoresist on the semiconductor substrate. A typical reticle is configured to pattern only one level of the circuit. Thus, a different reticle is used to form the pattern for each level of the circuit. In some cases, a reticle may contain multiple instances of the same pattern, allowing the pattern to be projected onto multiple die simultaneously.

A type of lithography system that employs multiple reticles is referred to as a step-and-repeat system, or stepper system. FIG. 2 is an elevational view of a basic stepper system. Stepper system 10 includes a light source 23, one or more lenses 24 for focusing the light, several reticles 25, and a cassette 22 for storing the reticles. The reticle library cassette is housed within a SMIF (standard mechanical interface) pod 20, which includes a base 21. In the example shown, a reticle 25A may be drawn from cassette 22 and placed between two lenses 24. Light from a light source 23 may then be selectively projected through reticle 25A and onto a portion of wafer 30. After the pattern has been projected onto the entire wafer 30 by stepping and repeating this exposure process, reticle 25A is placed back into the cassette. Wafer 30 then undergoes processing to form the next level patterned by another reticle. After the each level is formed, another layer of photoresist is applied in order to form the next layer of the circuit. Wafer 30 is then placed back into the stepper system 10, and a different pattern is projected onto it using another reticle drawn from cassette 22. The reticle library cassette 22 is enclosed within SMIF pod 20 in order to prevent particulate contamination ingress upon the reticles.

Despite the ability of the SMIF pod to prevent particulate contamination of the reticles, other defects may occur to individual reticles. Many reticles are constructed of materials that are not electrically conductive, such as quartz or glass, and are therefore susceptible to static charge. Sufficient charge accumulation may lead to electro-static discharge (ESD). If ESD occurs on a reticle, its pattern may be damaged. ESD damage, if left unchecked, may result in erroneous patterns being projected onto the photoresist, thereby causing the manufacture of defective integrated circuits, which usually must be scrapped. Furthermore, most reticles, once damaged, must be replaced. This expense is not insignificant, as some reticles may cost on the order of $10,000 to $15,000 to replace. Furthermore, many SMIF pods and reticle library cassettes are constructed of materials that are not electrically conductive, making them susceptible to static charge buildup. ESD problems can be even further compounded by the geometry of a given SMIF pod and reticle library cassette. In particular, sharp edges and corners may increase ESD hazards, as static charge tends to gravitate to and/or accumulate in the sharply defined edges and corners of non-conductive materials.

Given the high cost of reticles, as well as the potential for the manufacture of defective integrated circuits caused by reticle rendered defective by ESD, not to mention the lost production time replacing damaged reticles, it would be desirable to have a lithography system that effectively prevents ESD problems within a reticle storage vessel (e.g., SMIF pod). Such a desirous system should be one that would retain those features which prevent particulate contamination to the wafer and/or reticles. In so doing, the improved reticle storage vessel or system may implement certain novel ESD protection features.

SUMMARY OF THE INVENTION

The problems outlined above may in large part be solved by a lithography system designed for ESD prevention. In one embodiment, the lithography system includes a light source, one or more lenses, a number of reticles having one or more masks (patterns), and a reticle library cassette. The reticle library cassette containing the reticles is enclosed within a reticle carrier such as a SMIF (Standard Mechanical Interface) pod in order to prevent particulate contamination. A spring-loaded reticle retainer is attached to the inside walls of the reticle carrier to keep the reticles securely in place within the reticle library cassette. The system is also designed to prevent ESD damage to the reticles and wafer. In particular, the SMIF pod and reticle library cassettes are designed with ESD prevention in mind.

In various embodiments, a SMIF pod (as well as the reticle retainer attached to the inside wall) is constructed of an electrically conductive material. One such material is a polycarbonate plastic, which is then impregnated with carbon fibers. A SMIF pod constructed of polycarbonate plastic, impregnated with carbon fibers, may have a maximum electrical resistance on the order of $10^4$ ohms when measuring between the two most distant points on the pod. By impregnating the polycarbonate plastic with carbon fibers, conductivity of the material may be enhanced. However, the material selected may have enough resistivity to cause any static charges to drain slowly to a ground or reference point. Furthermore, to enhance the effectiveness for preventing static charge accumulation in areas susceptible to charge buildup (e.g. corners or edges of the SMIF pod), are rounded. As discussed above, static charges tend to accumulate near sharp edges and corners of objects. By eliminating sharp edges and corners, in conjunction with the use of a conductive material, static charge buildup may be minimized or even eliminated. The SMIF pod of such a design may effectively form an enclosed electrostatic shield, commonly known as a Faraday cage.

Various embodiments of the reticle library cassette may incorporate features similar to that of the reticle carrier. In particular, the ESD-safe reticle library cassette may be constructed of an electrically conductive material. For the cassette, these materials may include polycarbonate plastic (impregnated with carbon fibers), electrically conductive stainless steel, or other conductive material. As with the SMIF pod, the reticle library cassette may be designed to have a maximum measured resistance of $10^4$ ohms when measuring from the furthest two points of the cassette. In addition, as with the SMIF pod, the material used in fabrication of the reticle library cassette may have enough resistivity to prevent a rapid draining of static electrical charges to a ground or reference point. Incorporating the use of an electrically conductive material into the fabrication of the reticle library cassette may offer additional ESD protection for instances when the SMIF pod must be removed for changing reticles, repairs, or maintenance.

Thus, in various embodiments, the lithography system including a reticle carrier (e.g., SMIF pod) and reticle library cassette designed for ESD protection may prevent damage to reticles from static electricity. Constructing the reticle carrier from an electrically conductive material, as well as eliminating sharp corners and edges from the pod may allow static electricity charges near the pod to be drained to ground. Incorporating similar ESD protection features into a reticle library cassette may afford additional ESD protection when it is necessary to open or remove the carrier.

BRIEF DESCRIPTION OF THE DRAWINGS

A more thorough understanding of the present invention can be obtained by reading and following the detailed description of the preferred embodiment in conjunction with the following drawings, in which.

Figure 1:
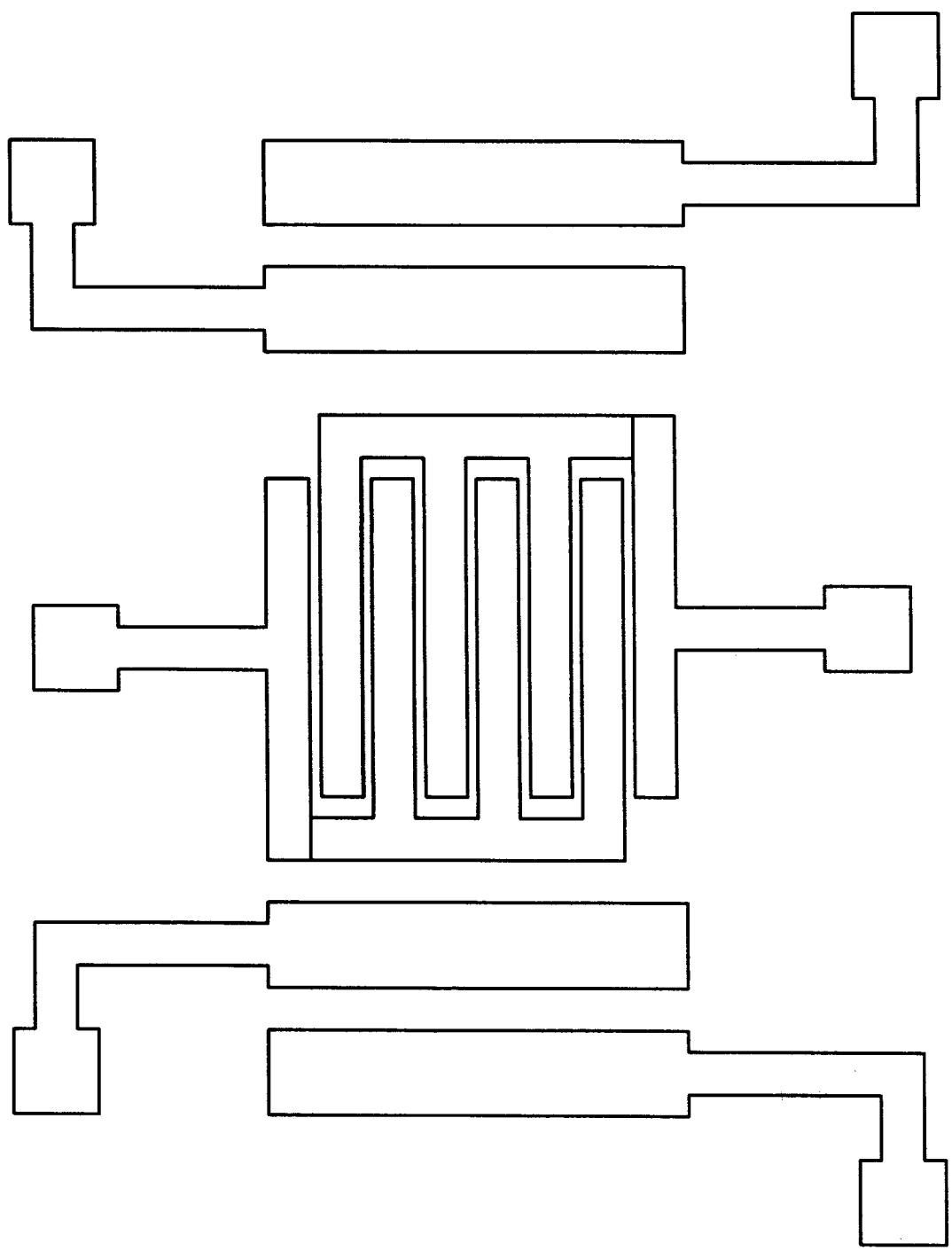
FIG. 1 (prior art) is a plan view of a reticle with a mask pattern.
Figure 2:
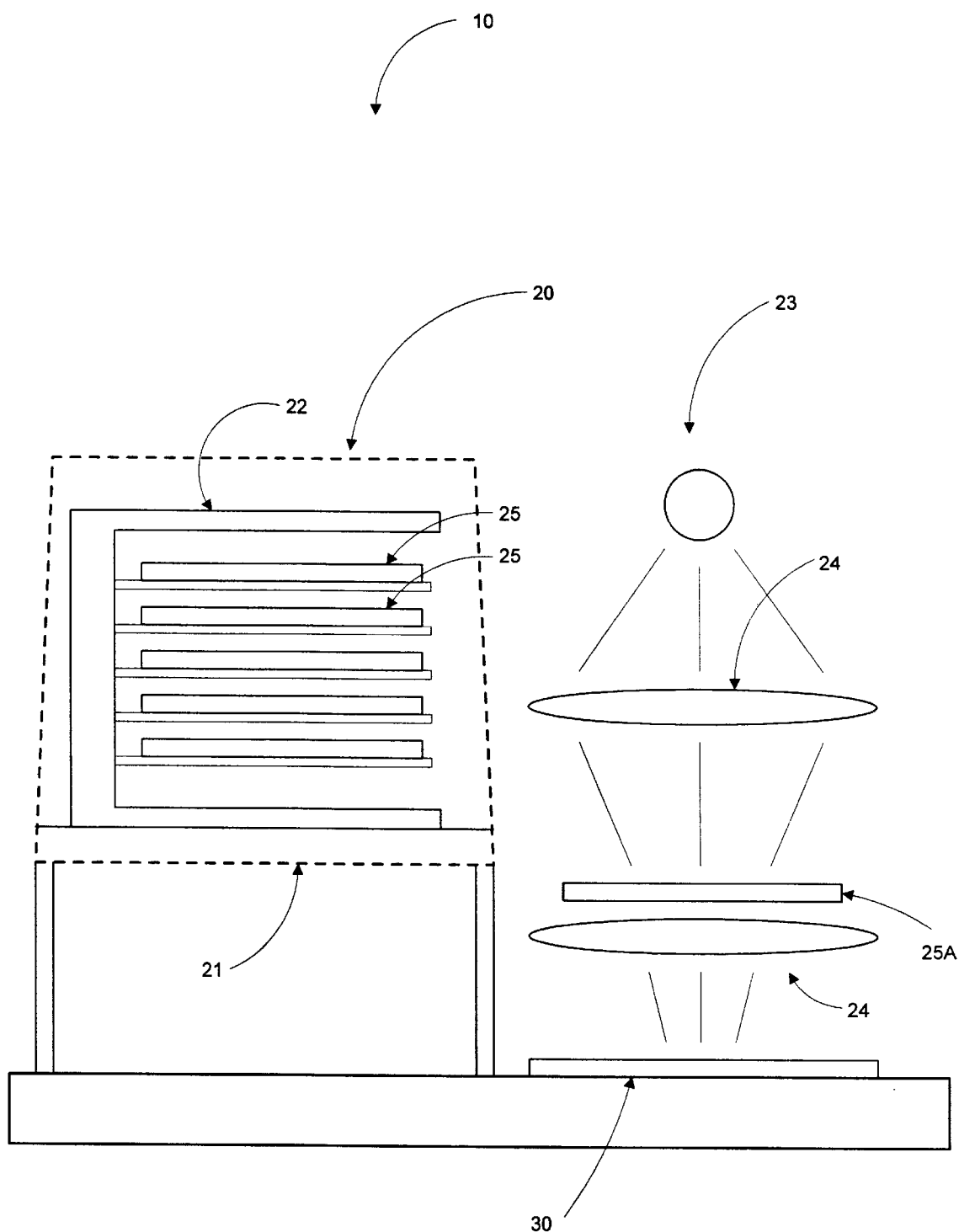
FIG. 2 (prior art) is an elevational view of a typical step-and-repeat projection system including a reticle library cassette enclosed within a SMIF pod.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Figure 3:
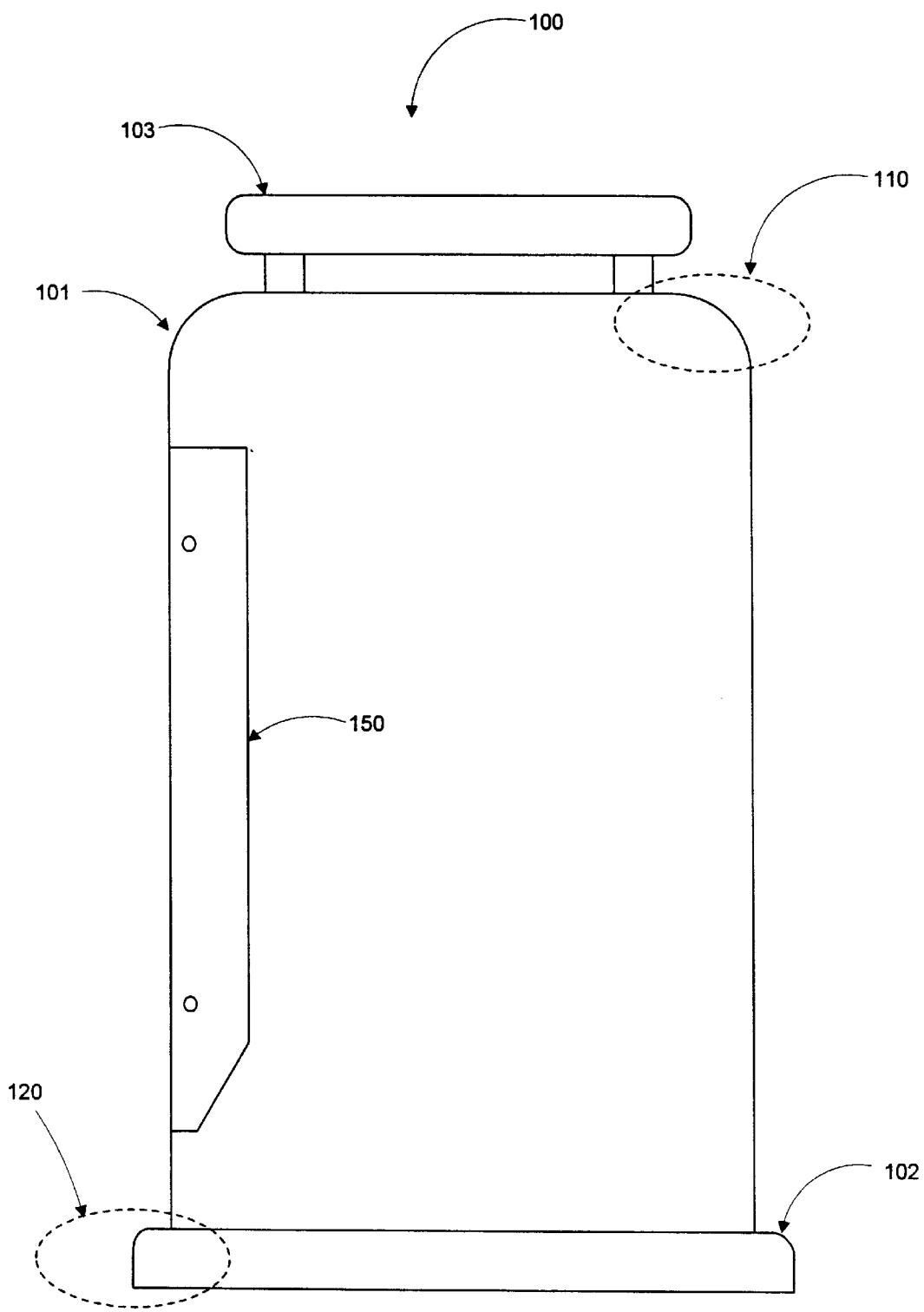
FIG. 3 is a side plan view of one embodiment of a reticle carrier, in this case a SMIF pod, with ESD protection features.

Turning now to FIG. 3, a side plan view of one embodiment of a reticle carrier, SMIF (Standard Mechanical Interface) pod 100 in his case, with ESD protection features is shown, SMIF pod 100 includes a container portion 101, a base 102 to which container portion 101 is attached, and a handle 103 for lifting the container portion when access to a reticle library cassette contained within is required. Other embodiments that include a door or lid for access to the reticle library cassette are possible and contemplated. Attached to an inside wall of SMIF pod 100 is reticle retainer 150 (to be explained further in reference to FIG. 5), which may be used to secure reticles in place within a reticle library cassette. SMIF pod 100 and a reticle library cassette contained within SMIF pod 100 may be components of a lithography system. Such a lithography system may include a light source, one or more lenses for focusing the light, and one or more reticles having a pattern, or mask, for transfer to a photoresist layer applied to a wafer or semiconductor. The reticles may be stored in the reticle library cassette. When multiple patterns must be transferred to a layer of photoresist, reticles may be swapped from the reticle library cassette for each different pattern. One or more wafers of semiconductor substrate may also be contained with in the lithography system for receiving the patterns from the various reticles.

Both the container portion 101 and base 102 of SMIF pod 100 are fabricated from an electrically conductive material, polycarbonate plastic in this embodiment, for protection from electrostatic discharge (ESD). Furthermore, the polycarbonate plastic may be impregnated with carbon fibers, which may increase the conductivity of the pod, thereby enhancing ESD protection. Using the electrically conductive material, SMIF pod 100 may be designed such that the maximum electrical resistance measured between any two points of the pod is on the order of $10^4$ ohms. Rounded edges/corners 110 and 120 (which will be discussed in further detail below) are incorporated into the design of the pod, and may help prevent static charge buildup on the surface of SMIF pod 100. SMIF pod 100 may be electrically connected to a ground, or a reference point, which may allow static charges to be drained from the pod. When fabricated from an electrically conductive material, SMIF pod 100 effectively forms an electro-static shield/enclosure around the lithography system. Such an electrostatic shield is commonly known as a Faraday cage to those skilled in the art.

As stated above, SMIF pod 100 may be fabricated with an electrically conductive material, and may be designed such that the maximum electrical resistance measured between any two points of the pod is on the order of $10^4$ ohms. This value may indicate that the material used to fabricate SMIF pod 100 has, despite its electrical conductivity, a significant amount of resistivity. The resistivity of the material used to fabricate SMIF pod 100 may allow static charges to drain to a reference point more slowly than a SMIF pod fabricated from more commonly known materials with a higher conductivity, such as aluminum. Draining a static charge in a slower manner may further enhance the ability of SMIF pod 100 to protect against ESD hazards.

Figure 4:
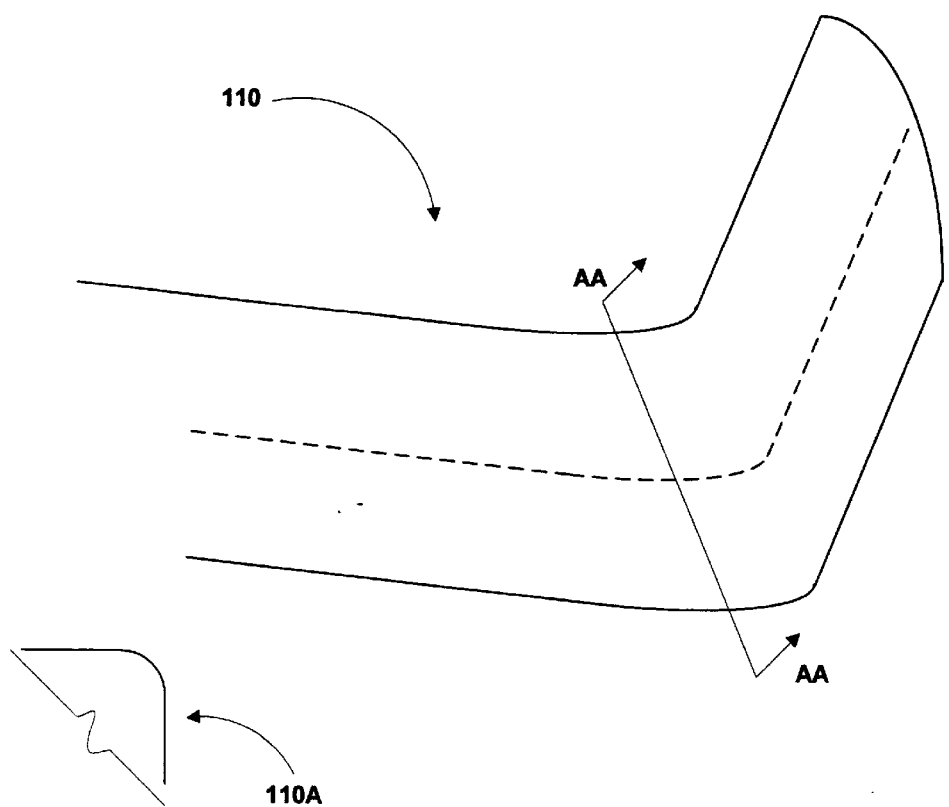
FIG. 4 is a perspective view of corner and edge details of the SMIF pod of FIG. 3.
Figure 4:
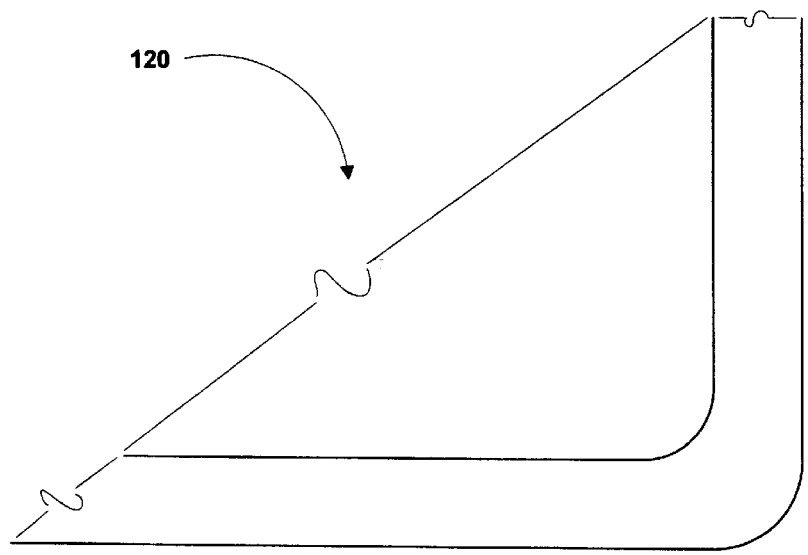

Moving now to FIG. 4, perspective views of corner and edge details of the SMIF pod of FIG. 3 are shown. Rounded edge/corner 110 is located near the top of container portion 101 of SMIF pod 100, while rounded edge/corner 120 is located on base portion 102 of SMIF pod 100. These two rounded edges/corners are exemplary of most, if not all edges and corners of SMIF pod 100. Rounded edge/corner 100 is rounded at the corner as shown. A cross-section 110A, defined by the plane AA as shown, illustrates the rounding of the edge. This rounded edge extends along the length of each side of SMIF pod 100, and through each corner. Thus, rounded edge/corner 100 is rounded both horizontally and vertically. In a similar fashion, rounded edge/corner 120 located on the base of SMIF pod 100 is also rounded both horizontally and vertically, and may include a rounded edge similar to that shown in cross-section 110A. Fabricating SMIF pod 100 with rounded corners and edges may further enhance its ability to prevent ESD hazards. Often times, static electrical charges tend to accumulate near sharp edges and corners. Eliminating sharp edges and corners from the design of SMIF pod 100 may further reduce those areas in which static charge buildups can occur.

Figure 5:
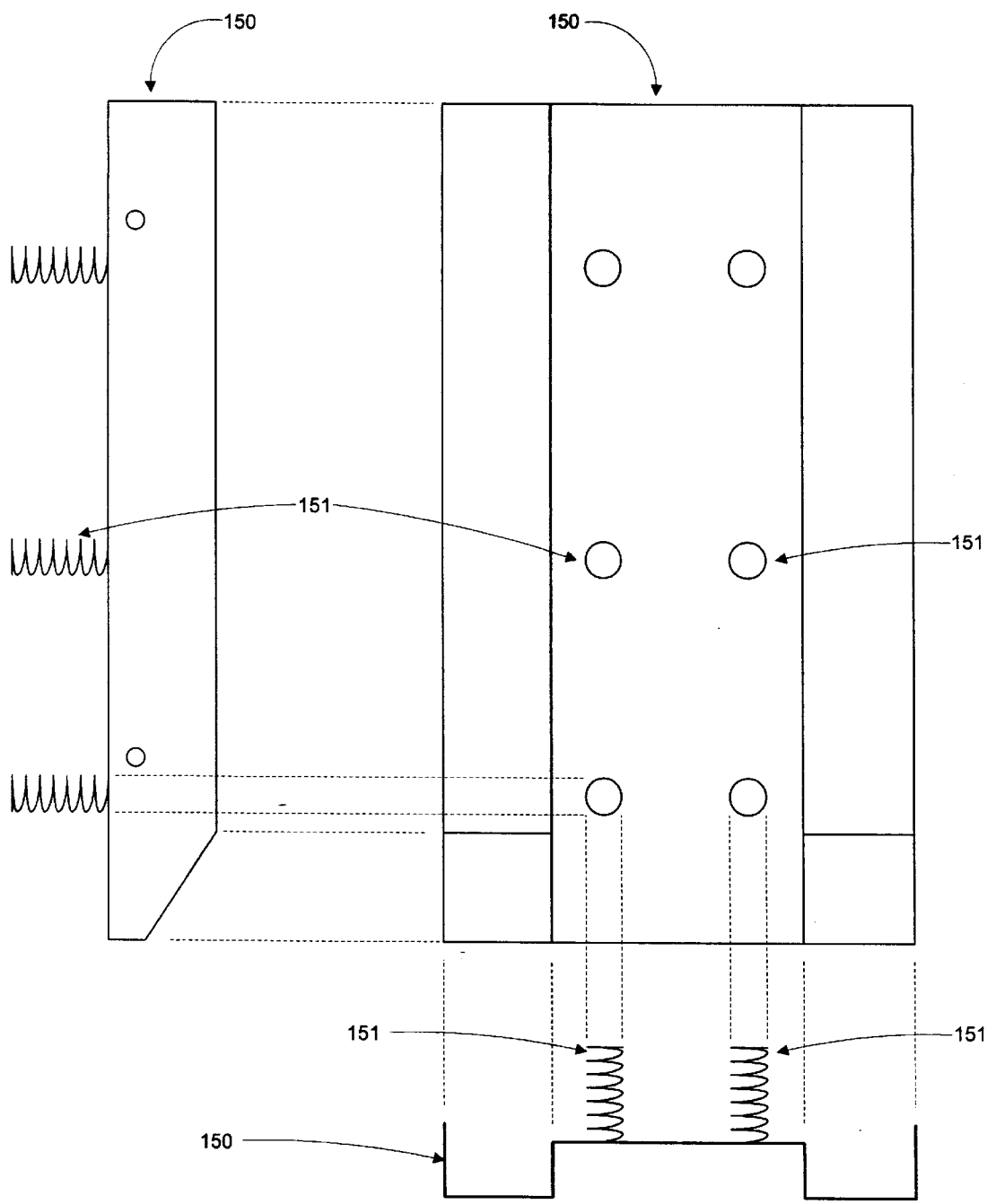
FIG. 5 is a perspective view of details of one embodiment of a reticle retainer attached to the inside wall of the SMIF pod of FIG. 3.

FIG. 5 is a perspective view of details of one embodiment of a reticle retainer 150. Reticle retainer 150 is attached to an inside wall of SMIF pod 100 of FIG. 3. Reticle retainer 150 includes a plurality of springs 151, which are used to secure the reticles in place within a reticle library cassette. Springs 151 are each configured to apply force to the inner walls of SMIF pod 100. This may allow the reticle to remain securely in position when the SMIF pod is moved to another location. Reticle retainer 150 and springs 151 may both be fabricated from electrically conductive materials. For example, reticle retainer 150 may be fabricated from a polycarbonate plastic impregnated with carbon fibers, while springs 151 may be fabricated from electrically conductive stainless steel. As with SMIF pod 100 of FIG. 3, corners and edges of reticle retainer 150 may be rounded, which may eliminate or reduce the number of areas on the retainer where static charge buildups may occur.

Figure 6:
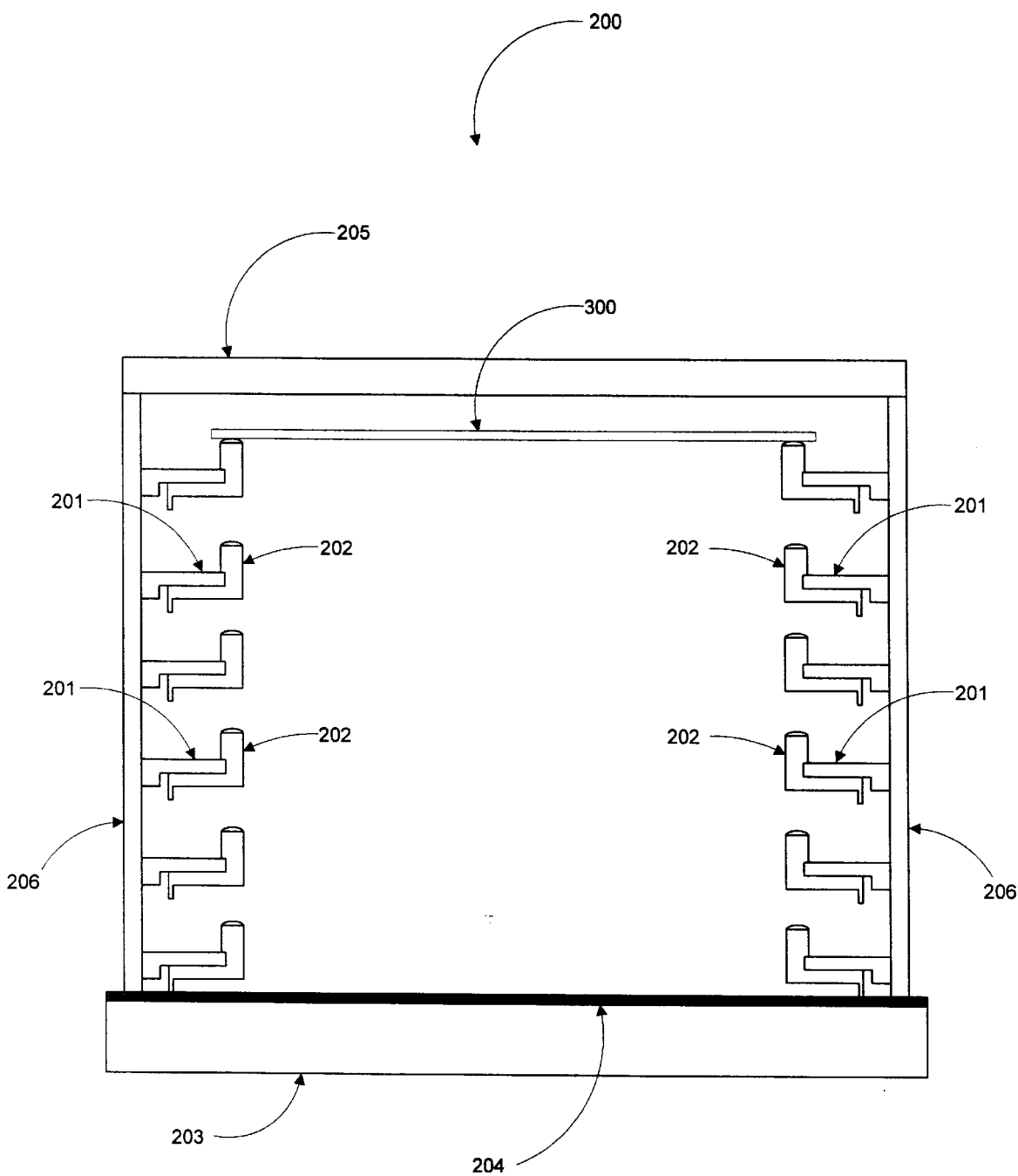
FIG. 6 is a perspective view of one embodiment of a reticle library cassette.

FIG. 6 is a perspective view of one embodiment of a reticle library cassette 200. Reticle library cassette 200 includes a base 203, sidewalls 206, and a top 205. L-braces 201 are mounted upon sidewalls 206 with a corresponding L-brace 201 mounted upon the opposing sidewall 206 at the same height above the base. Attached to each L-brace 201 is a reticle support 202. Pairs of reticle supports 202 are used for storing reticles within the cassette. As shown in the drawing, reticle 300 is stored in the uppermost location within reticle library cassette 200, resting upon reticle supports 202 attached to L-braces 201 mounted upon opposing sidewalls. An O-ring 204 is located on base 203 for the purpose of forming a seal when a reticle pod is placed over reticle library cassette 200.

Reticle library cassette 200 and its various components may be fabricated from electrically conductive materials. For example, in the embodiment shown, base 203, top 205, and sidewalls 206 of reticle library cassette may be fabricated from electrically conductive stainless steel, as may be L-braces 201. O-ring 204 and reticle supports 202 may be fabricated from polycarbonate plastic impregnated with carbon fibers. Impregnating the polycarbonate plastic with carbon fibers may further enhance its conductivity. Broadly speaking, any of the parts shown in FIG. 6 may be fabricated from a variety of electrically conductive materials. For example, an alternate embodiment wherein all parts are fabricated from polycarbonate plastic with carbon fibers is possible and contemplated. By using electrically conductive materials for the various parts of reticle library cassette 200, ESD hazards may be prevented by draining static charges to a ground or reference point. As with SMIF pod 100 of FIG. 3, the materials used in the fabrication of the various parts of reticle library cassette 200 may have enough resistivity to allow static charges to drain to ground more slowly than if a material of a higher conductivity, such as copper, was used.

Figure 7:
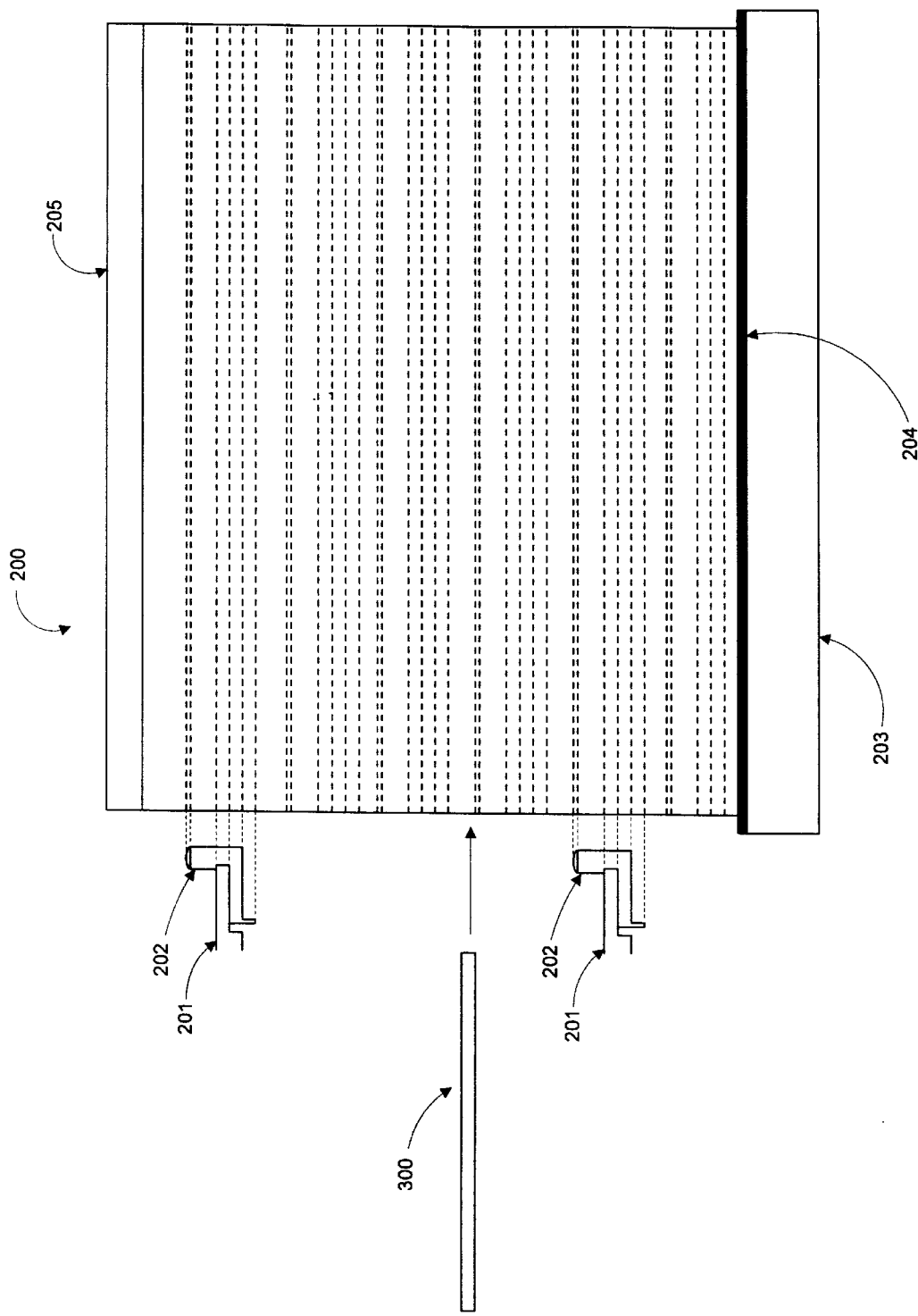
FIG. 7 is a side plan view of the reticle library cassette of FIG. 5.

FIG. 7 is a side plan view of the reticle library cassette 200 of FIG. 6. Projections of the front view of L-braces 202 and reticle supports 201 are shown for clarity. L-braces 202 and reticle supports 201 extend the length of sidewalls 206. Reticle 300 may be loaded from the front of reticle library cassette 200.

Figure 8A:
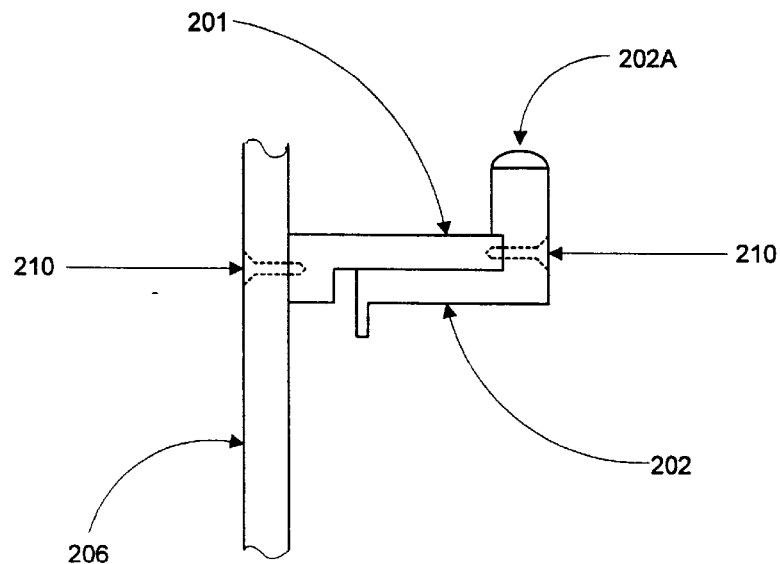
FIG. 8A is a perspective view illustrating details of the embodiment of the reticle library cassette shown in FIGS. 5 and 6.
Figure 8B:
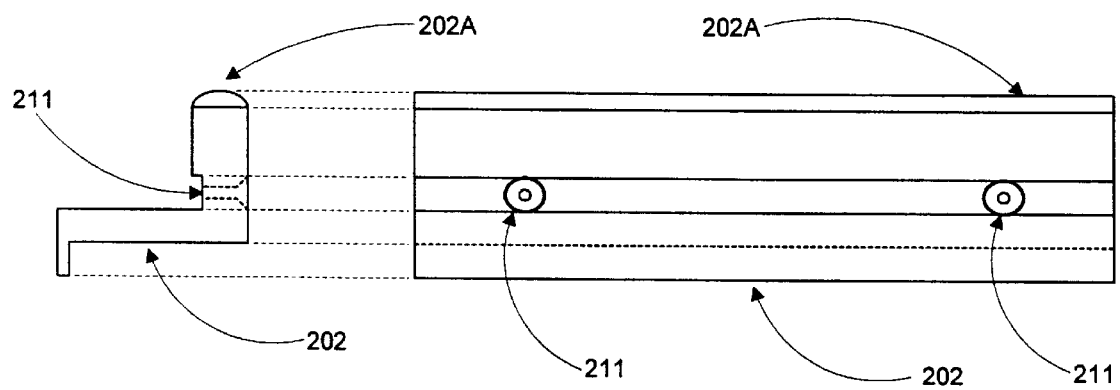
FIG. 8B is a perspective view illustrating details of a reticle support associated with the embodiment of the reticle library cassette shown in FIGS. 5 and 6; and, FIG. 9 is an elevational view of a lithography system incorporating the SMIF pod of FIG. 3 and the reticle library cassette of FIGS. 6 and 7.

FIGS. 8A and 8B are perspective views illustrating details of the embodiment of the reticle library cassette 200 shown in FIGS. 6 and 7. In FIG. 8A, details illustrating the mounting of L-braces 201 and reticle supports 202 are shown. L-brace 201 is mounted to sidewall 206, and held in place by fastener 210. Fastener 210 in this embodiment is a stainless steel screw. Other embodiments may use other types of fasteners made of various materials which may be electrically conductive. Similarly, reticle support 202 is held in place by another fastener 210. Reticle support 202 includes a reticle pad 202A, upon which a portion of a reticle will rest during storage in reticle library cassette 200. Reticle pad 202A may be fabricated from an electrically conductive material, such as polycarbonate plastic impregnated with carbon fibers. The form of the material used for reticle pad 202A may be soft in order to avoid damage (e.g. scratches) to reticles when inserting or removing from a cassette.

Reticle support 202 is illustrated in greater detail in FIG. 8B. Both front and side views are shown in this drawing. Reticle support 202 is designed to extend along the full length of sidewall 206 shown in FIG. 7. Reticle support 202 includes reticle pad 202A. In the embodiment shown, reticle pad 202A extends along the length of reticle support 202. A plurality of smaller reticle pads may be used instead of the longer reticle pad used in the embodiment shown. Reticle support 202 also includes fastener holes 211, into which a fastener is inserted when mounting to L-brace 201. For the embodiment shown, a countersunk screw is used as a fastener, although other types of fasteners are possible and contemplated.

Figure 9:
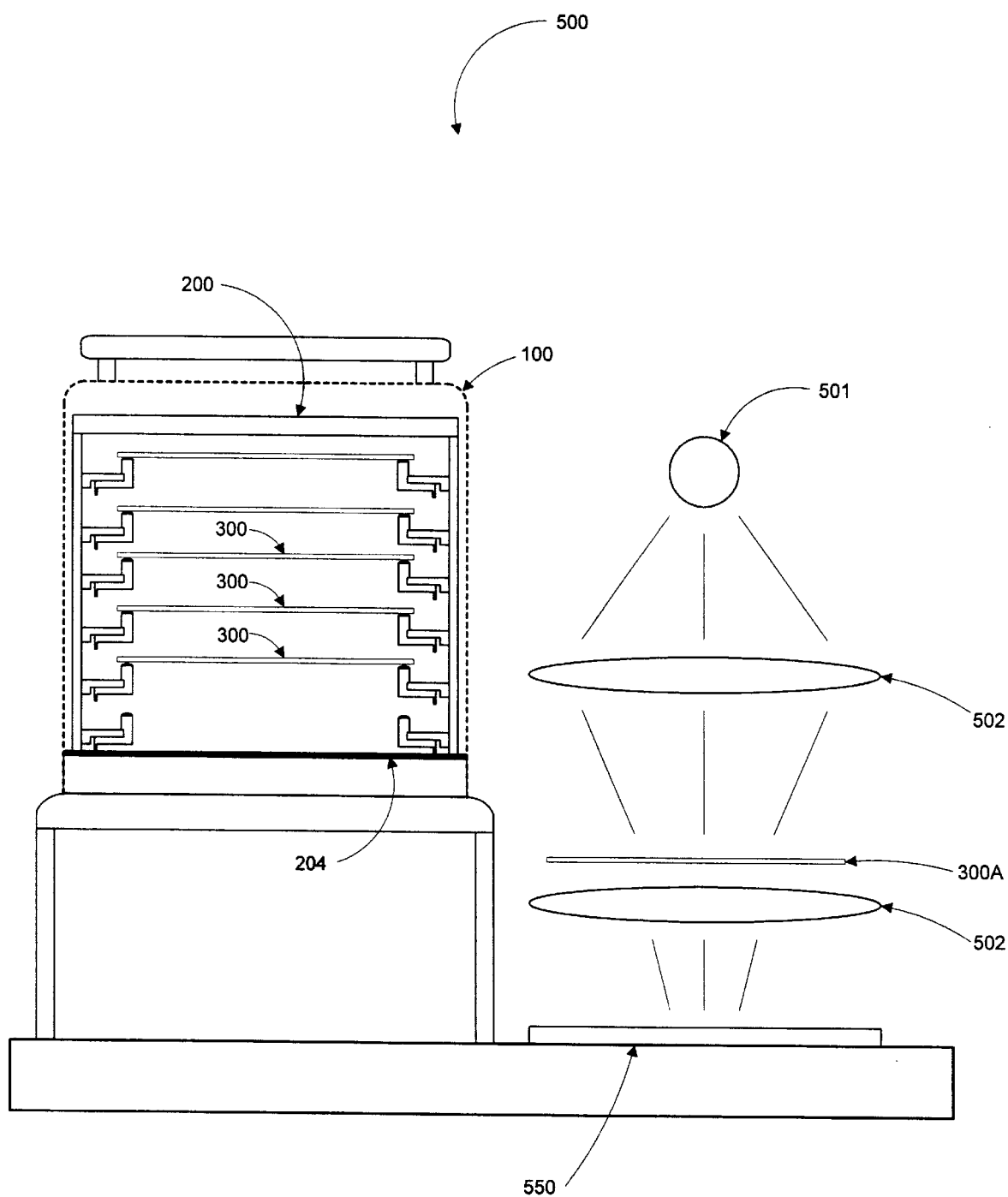

Turning now to FIG. 9, an elevational view of a lithography system incorporating the SMIF pod of FIG. 3 and the reticle library cassette of FIGS. 6 and 7 is shown. Lithography system 500 includes a light source 501, lenses 502 for focusing the light, and a reticle 300A which includes a mask, or pattern, for transfer to a layer of photoresist on semiconductor wafer 550. Additional patterns to be transferred are located on reticles 300, which are stored in reticle library cassette 200. Reticle library cassette 200 is contained within SMIF pod 100. O-ring 204 of reticle library cassette 200 provides a seal against the inner walls of SMIF pod 100 in order to prevent particulate contamination from entering the SMIF pod, which could possibly damage the reticles. SMIF pod 100 is fabricated substantially from an electrically conductive material, such as a polycarbonate plastic impregnated with carbon fibers, which may help prevent ESD damage to the reticles. SMIF pod 100 also includes rounded edges and corners, which may prevent buildups of static charges in these areas. Similar to SMIF pod 100, reticle library cassette 200 is fabricated substantially from an electrically conductive material, such as electrically conductive stainless steel as a measure to prevent ESD damage to the reticles.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A reticle carrier comprising:
   a container portion having rounded edges and corners, said container portion fabricated from an electrically conductive material, wherein said container portion is configured to enclose a reticle library cassette containing a plurality of photolithography reticles, wherein said reticles are secured within said library cassette with a plurality of springs, and wherein said plurality of springs are configured to apply a force to inner walls of said container portion to secure said reticles within said reticle library cassette; and,
   a base portion having rounded edges, said base portion fabricated from an electrically conductive material, wherein said base portion is configured to attach to said container portion.

2. The reticle carrier as recited in claim 1, wherein said electrically conductive material is a polycarbonate plastic impregnated with carbon fibers.

3. The reticle carrier as recited in claim 2, wherein the maximum electrical resistance between any two points of said reticle carrier is substantially $10^4$ ohms.

4. The reticle carrier as recited in claim 3, wherein said container portion is a Faraday cage.

5. The reticle carrier as recited in claim 1, wherein said reticle library cassette is fabricated from an electrically conductive material.

6. The reticle carrier as recited in claim 5, wherein the maximum resistance between any two points of said reticle library cassette is substantially $10^4$ ohms.

7. The reticle carrier as recited in claim 6, wherein said electrically conductive material of said reticle library cassette is a polycarbonate plastic impregnated with carbon fibers.

8. The reticle carrier as recited in claim 6, wherein said electrically conductive material of said reticle library cassette is electrically conductive stainless steel.

9. The reticle carrier as recited in claim 1 further comprising at least one reticle retainer attached to an inside wall of said container portion, said reticle retainer having rounded edges and corners and including a plurality of springs, wherein said reticle retainer is fabricated from an electrically conductive material.

10. A reticle library cassette having a base, sidewalls, and top, said reticle library cassette comprising:
    a plurality of L-brace supports mounted to said sidewalls;
    a plurality of reticle supports mounted to said L-brace supports by fasteners, said reticle supports including a reticle pad, wherein each pair of said reticle supports mounted to said L-brace supports mounted upon said sidewalls opposing each other is configured to store a reticle, said reticle having one or more masks; and,
    wherein said base, said top, said sidewalls, said L-brace supports, said fasteners, and said reticle supports are fabricated substantially of an electrically conductive material.

11. The reticle library cassette as recited in claim 10, wherein maximum resistance between any two points of said reticle library cassette is $10^4$ ohms.

12. The reticle library cassette as recited in claim 11, wherein said electrically conductive material is a polycarbonate plastic impregnated with carbon fibers.

13. The reticle library cassette as recited in claim 11, wherein said electrically conductive material is electrically conductive stainless steel.

14. A lithography system comprising:
    a light source;
    at least one lens for focusing light from said light source;
    at least one reticle, said reticle having a pattern for transfer to a layer of photoresist applied to a semiconductor substrate;
    a reticle carrier comprising a container portion, wherein said reticle carrier is fabricated substantially of an electrically conductive material, and wherein said reticle carrier includes rounded edges and corners; and
    a reticle library cassette arranged within said container portion, wherein said library cassette is configured to store a plurality of reticles for use in transferring said patterns to a layer of said photoresist applied to said semiconductor substrate, wherein said reticles are secured within said library cassette with a plurality of springs, wherein said plurality of springs are configured to apply a force to inner walls of said container portion to secure said reticles within said reticle library cassette, and wherein said reticle library cassette is fabricated substantially of an electrically conductive material.

15. The lithography system as recited in claim 14, wherein said electrically conductive material of said reticle carrier is a polycarbonate plastic impregnated with carbon fibers.

16. The lithography system as recited in claim 15, wherein maximum electrical resistance between any two points of said reticle carrier is substantially $10^4$ ohms.

17. The lithography system as recited in claim 16, wherein said reticle carrier is a Faraday cage.

18. The lithography system as recited in claim 14, wherein maximum resistance between any two points of said reticle library cassette is $10^4$ ohms.

19. The lithography system as recited in claim 18, wherein said electrically conductive material of said reticle library cassette is a polycarbonate plastic impregnated with carbon fibers.

20. The lithography system as recited in claim 18, wherein said electrically conductive material of said reticle library cassette is electrically conductive stainless steel.

21. The lithography system as recited in claim 14, wherein said reticle carrier further comprises at least one reticle retainer attached to an inside wall of said container portion, said reticle retainer having rounded edges and corners and including a plurality of springs, wherein said reticle retainer is fabricated from an electrically conductive material.

* * * * *